United States Patent [19]

Deslattes

[11] Patent Number: 5,295,176
[45] Date of Patent: Mar. 15, 1994

[54] METHOD AND APPARATUS FOR PRECISELY MEASURING ACCELERATING VOLTAGES APPLIED TO X-RAY SOURCES

[75] Inventor: Richard D. Deslattes, Rockville, Md.

[73] Assignee: The United States of America as represented by the Secretary of Commerce, Washington, D.C.

[21] Appl. No.: 21,232

[22] Filed: Feb. 23, 1993

[51] Int. Cl.⁵ ............................................. G01D 18/00
[52] U.S. Cl. ...................................... 378/207; 378/204
[58] Field of Search ............... 378/207, 204, 111, 112, 378/98

[56] References Cited

U.S. PATENT DOCUMENTS

| | | | |
|---|---|---|---|
| 3,766,383 | 10/1973 | Harris et al. | 378/207 X |
| 4,442,496 | 4/1984 | Simon et al. | 364/524 |
| 4,843,619 | 6/1989 | Sheridan | 378/207 |
| 4,916,727 | 4/1990 | Sheridan | 378/207 |
| 4,935,950 | 6/1990 | Ranallo et al. | 378/207 |
| 5,081,664 | 1/1992 | Lie et al. | 378/207 |

FOREIGN PATENT DOCUMENTS

0045156 2/1982 European Pat. Off. .

OTHER PUBLICATIONS

Encyclopedia of Physics, vol. XXX, 1957, pp. 338-370

Jacobson, "Test Cassette For Measuring Peak Tube Potential of Diagnostic X-Ray Machine", Medical Physics, vol. 3, No. 1, 1976, pp. 19-25.

National Physical Laboratory, 1991, pp. 1-3.

Law, "The Measurement And Routine Checking Of Mammography X-ray Tube kV", Phys. Med. Biol., vol. 36, No. 8, 1991, pp. 1133-1139.

Primary Examiner—David P. Porta
Attorney, Agent, or Firm—Jeffrey A. Wyand

[57] ABSTRACT

A method of measuring an accelerating voltage applied to an x-ray source to produce x-rays includes applying an accelerating voltage to an x-ray source to produce x-ray radiation having an axis; diffracting first and second portions of the x-ray radiation that are symmetrically disposed relative to an axis with a single crystal material to produce two spectra of the x-ray radiation, each spectrum including continuous x-ray radiation having an end point energy at the maximum energy of the x-ray radiation; forming an image of the spectra of the x-ray radiation including respective end point energies; and measuring the separation of the respective end point energies of the spectra of the image and, thereby, determining the accelerating voltage applied to the x-ray source.

12 Claims, 2 Drawing Sheets

METHOD AND APPARATUS FOR PRECISELY MEASURING ACCELERATING VOLTAGES APPLIED TO X-RAY SOURCES

FIELD OF THE INVENTION

The present invention concerns a method of accurately measuring the accelerating voltage applied to an x-ray tube to accelerate electrons against a target, resulting in the production of x-ray radiation. The invention also relates to an apparatus for rapidly and precisely measuring the accelerating voltage.

BACKGROUND OF THE INVENTION

In medical applications, x-ray radiation is conventionally produced within an evacuated tube. Electrons are generated by a source, such as a heated filament, and accelerated by a high voltage applied to an accelerating electrode. The accelerated electrons are directed toward and impact on a metal target, typically tungsten or molybdenum, resulting in the production of x-ray radiation. Typically, the peak accelerating voltage (kVp) is at least 15,000 volts and can be up to ten times higher. The accelerating voltage employed depends upon the diagnostic or therapeutic use being made of the x-ray radiation. The x-ray radiation increases in penetrating power with an increase in the accelerating voltage applied to the x-ray source.

In diagnostic applications of x-rays, the amount of radiation that passes through an object being analyzed with x-rays determines the contrast of a radiographic image on a fluoroscopic screen or photographic film. In some applications, moderate variations in x-ray penetrating power due to variations in the accelerating voltage applied to the x-ray source do not significantly affect x-ray analysis. For example, small variations in the contrast of photographic x-ray images of broken bones do not affect the ability of a radiologist and/or orthopedist to determine the location and nature of a bone fracture. However, in other applications of x-ray imaging, the contrast of a photographic x-ray image can be critical to accurate diagnosis of a disease or disorder. Two important examples where radiographic contrast control is of substantial or critical importance are mammography and coronary angiography. In those applications, variations in image contrast caused by even moderate variations in accelerating voltage can result in erroneous diagnoses. Therefore, precise measurement of the accelerating voltage applied to an x-ray tube is essential to proper diagnosis and treatment of important, potentially life-threatening diseases and disorders.

Measurement of the relatively high voltages applied to x-ray tubes used as x-ray radiation sources in radiological equipment presents numerous technological problems. Direct measurement of such high voltages is, in principle, straightforward for constant potentials and low frequency accelerating voltages. In the early development of x-ray equipment, power supplies for producing such high voltages were relatively large and frequently encased in a liquid dielectric medium, such as oil. Nevertheless, the output voltage terminals of the accelerating voltage power supply were accessible. In order to measure the accelerating voltage applied to an x-ray tube, a high tension voltage divider was connected across the output terminals of the accelerating voltage power supply so that a portion of the high voltage could be measured. The accelerating voltage could be calculated based upon the voltage dividing ratio of the voltage divider. These voltage dividers function well for the direct current and the low frequency components of the accelerating voltage kVp produced by older x-ray equipment. However, modern x-ray equipment produces accelerating voltages with high frequency components and complex waveforms that conventional voltage dividers cannot accurately measure without specific calibration of the dividers.

Typically, medical x-ray equipment includes a voltage control for varying the accelerating voltage so that the equipment can be used in various applications. The equipment usually includes an indicator, such as a dial or a meter, for indicating the accelerating voltage. The indicator is not directly connected to the accelerating voltage produced by the high voltage power supply but is actually connected to measure a lower voltage input to the accelerating voltage power supply. Historically, the accelerating voltage indicator was calibrated by connecting a voltage divider directly to the accelerating voltage power supply, setting the voltage control to a number of positions, measuring the actual accelerating voltage across the voltage divider for each position of the voltage control, and adjusting the indicator as necessary. The voltage divider is not present during medical use of the equipment so that a radiological technician depends upon the accuracy of the calibration of the indicator when setting the accelerating voltage for x-ray imaging or treatment. With the passage of time, the indicator can become inaccurate and periodic recalibrations are required to restore the accuracy of the indicator. In fact, governmental regulatory bodies frequently require periodic recalibration of x-ray equipment to maintain minimum standards of health safety.

Although power supplies in older x-ray equipment typically directly produced the pulsating, i.e., with some degree of ripple, direct current accelerating voltages using transformers, rectifiers, and capacitive filters, modern x-ray accelerating voltage power supplies are more complex. Modern x-ray equipment power supplies may employ toroidal transformers and inverters as well as rectifiers operating at various frequencies and with pulsed signals having complex waveforms to produce the accelerating voltage. Many parts of the modern power supplies are encapsulated in resins and do not permit access for the connection of a high tension voltage divider for calibrating the accelerating voltage indicator of the equipment.

Non-invasive, i.e., without direct electrical connection, techniques are and may have to be employed to calibrate the accelerating voltage indicators of modern x-ray equipment. One known technique employs two or more metal foils of different thicknesses, generally arranged serially with respective x-ray radiation detectors. In most cases the foils are made of the same materials. The different thicknesses of the foils cause different modifications of incident x-ray radiation that reaches the detectors. The relative intensities of the radiation that penetrates the respective foils is measured and compared, sometimes in a complex mathematical relationship, to determine an empirical correlation between differences in the radiation intensities measured by the respective detectors and accelerating voltage. Convenient methods of evaluating the measured radiation intensities produce results that depend upon the waveform of the accelerating voltage and, therefore, are not universally applicable to all x-ray equipment. Depending upon the voltage applied to the x-ray tube, the accuracy of voltage measurements using single foils ranges from five to ten percent, for example, ±2 kV when kVp is 20 kV.

An improvement in measurement accuracy as compared to the use of foils of the same material, at least for measuring a single accelerating voltage, can be achieved when filters of different materials are used. Any of the elements having atomic numbers between 40 and 60 may be used as one of the filters. A second filter having a much lower atomic number and an x-ray absorption characteristic matched to that of the first filter over part of a radiation energy range is used. The single acceleration voltage calibration point is unique to the specific elements used in the filters. In one commercially available filter pair, cadmium and aluminum are used in tandem with a photodiode detector. The photodiode is sensitive to x-rays that penetrate the filters. As the voltage applied to the x-ray tube is increased, significantly different x-ray penetration of the cadmium and aluminum filters occurs, as indicated by the photodiode detector, once the peak accelerating voltage, kVp, exceeds 26.5 kV. Thus, the cadmium and aluminum filter pair provides a precise indication of a single accelerating voltage. Other pairs of filter materials can be used to identify additional individual accelerating voltages precisely although the use of many such filter pairs to detect many accelerating voltages is cumbersome.

Improved precision in accelerating voltage measurement can be made using an ionization spectrometer that measures the shape of the x-ray spectrum near the end point energy. The spectrum of electromagnetic energy produced by an x-ray tube has two recognized components. First, the x-ray spectrum includes sharp "lines" of relatively intense x-ray radiation at wavelengths that are characteristic of and well established for various x-ray tube target materials. These radiation components, typically generally identified as $K\alpha$ and $K\beta$ lines, result from the transfer of energy from accelerated electrons to atoms of the target, followed by energy transitions between inner shell electron energy states of target atoms that produce x-ray radiation. The energy transitions between well defined energy levels account for the specific energies of the line components of the radiated x-ray spectrum.

Second, in addition to the sharp lines in the x-ray spectrum, a more broadly distributed component of continuous x-ray radiation is also produced. This radiation, the so-called Bremsstrahlung, results from the scattering of accelerated electrons by the target accompanied by emission of x-ray radiation having energies equal to the energies given up by the electrons in the scattering process. The energies given up are not confined to discrete energies so that a broad x-ray energy distribution, i.e., a continuous x-ray spectrum, is produced. The maximum energy loss that can occur in the electron scattering process occurs when all of the kinetic energy of an accelerated electron is lost and is converted to x-ray radiation. Since the kinetic energy of an accelerated electron equals the electronic charge, e, of the electron multiplied by the accelerating voltage, that total kinetic energy loss produces the highest energy x-rays within the continuous component of the x-ray spectrum. That energy, which may be measured in terms of the maximum frequency or the minimum wavelength of the x-ray radiation, is referred to as the end point energy because it is the upper energy limit of, i.e., end point of, the continuous component of the x-ray radiation.

In an ionization spectrometer, the shape of the x-ray spectrum near the end point energy is measured by analyzing charge pulses produced in a crystalline material, such as intrinsic germanium, in response to incident x-ray radiation. However, despite the improved voltage measurement accuracy achieved with an ionization spectrometer as compared to the use of foils and filters, ionization spectrometer measurements can only be made while a relatively low electron beam current flows in the x-ray tube. Higher currents increase the quantity of x-ray radiation produced and cause overlapping charge pulses in the crystal that cannot be reliably analyzed. Since the spectrometer can only analyze one charge pulse at a time, accelerating voltage measurement using an ionization spectrometer takes a relatively long time. The measured results must be extrapolated for practical electron beam currents, and errors may be introduced in the extrapolation if the accelerating voltage waveform is current-dependent.

Accordingly, it would be desirable to provide a method and apparatus for accurately measuring the accelerating voltage applied to an x-ray tube. Most preferably, the apparatus is portable and the method is simple so that calibration of existing clinical x-ray equipment can be carried out at the site of the equipment, without modification of the equipment, by a technician rather than a scientist, and without undue interruption in the medical use of the equipment.

SUMMARY OF THE INVENTION

The invention provides a method of precisely measuring the accelerating voltage applied to an x-ray tube using a simple apparatus with a direct reading taken from a spectrographic image of the radiation produced by the x-ray tube. The end point energy at the end of the continuous component of the x-ray radiation spectrum is precisely located as an indication of the voltage applied to the x-ray tube. The accelerating voltage indicator of an x-ray apparatus is calibrated by measuring the accelerating voltage at each of a number of accelerating voltages and voltage indications and producing a correction table or graph correlating the indicated accelerating voltage with the actually applied accelerating voltage.

According to one embodiment of the invention, an accelerating voltage is applied to an x-ray source to produce x-ray radiation. A portion of the x-ray radiation is diffracted with a single crystal material to produce a spectrum of the x-ray radiation including a continuous x-ray radiation component having an end point energy at a maximum energy of the x-ray radiation. An image of the spectrally dispersed x-ray radiation including the end point energy is formed and one of the wavelength and frequency of the energy end point and, thereby, the accelerating voltage applied to the x-ray source is determined. Preferably, two portions of the x-ray radiation that are symmetrically disposed relative to an axis are dispersed with the same single crystal material to form symmetrical, mirror image spectra of the x-ray radiation. The mirror image spectra include respective end point energies. The spacing between the two end point energies in the mirror image, indicates, within an accuracy of about 0.1 kV, the accelerating voltage applied to the x-ray tube.

The x-ray spectrum or spectra image may be formed on a photographic film or on a scintillation screen. In a preferred apparatus for employing the novel method, a scintillation screen is disposed on a charge coupled device (CCD) camera so that an image, in light, of the x-ray spectrum or spectra formed by the scintillation screen is converted into an electrical image by the CCD camera. The electrical image is supplied to a computer for analysis and automatic determination of the accelerating voltage applied to the x-ray source.

DESCRIPTION OF THE PREFERRED EMBODIMENTS

Figure 1:
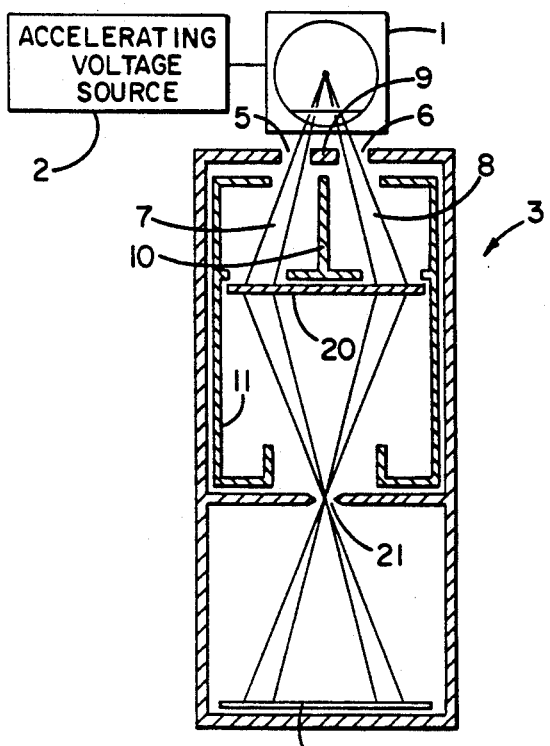
FIG. 1 is a schematic plan view of an x-ray spectrograph used in a method according to the invention.

FIG. 1 is a plan view, partially in section, illustrating a spectrograph and other elements used in an embodiment of the invention. The illustrated spectrograph is a version of a Rutherford-Andrade spectrograph that was first described about 1914. In the apparatus of FIG. 1, an x-ray tube 1 has an accelerating voltage applied to it from a variable magnitude accelerating voltage source 2. A spectrograph 3 having an entrance is placed adjacent the x-ray tube 1. X-ray radiation generated in the x-ray tube 1 enters the spectrograph 3 through the entrance. In FIG. 1, the entrance includes two spaced apart openings 5 and 6 for admitting two portions of the x-ray radiation. In this embodiment, the x-ray radiation is generated by a mammography apparatus that produces a relatively small x-ray source area. In other embodiments of the apparatus, particularly with broader x-ray source areas, the entrance of the spectrograph may be a slit with knife edges. Radiation portions 7 and 8, admitted through openings 5 and 6, respectively, form acute angles that are symmetrically disposed with respect to an axis of symmetry of the spectrograph 3. A lead shield 9 and baffles 10 and 11 absorb incident x-ray radiation but allow portions 7 and 8 to be transmitted.

The two portions 7 and 8 of the x-ray radiation produced by the tube 1 are incident on a single crystal material 20. As well known in the art, single crystal materials have a periodic structure that diffracts and disperses incident x-ray radiation provided the spacing, d, between layers of atoms in the single crystal material has an appropriate relationship with the wavelength of the incident x-rays. X-rays are diffracted at an angle $\theta$ by the single crystal material when the relationship $n\lambda = 2d \sin \theta$ is satisfied, where $\lambda$ is the wavelength of the x-ray radiation and n is the order of the reflection, assumed here to be one. Since, in a single crystal material, d is fixed for a particular orientation of the single crystal material, incident x-ray radiation having a variable wavelength, i.e., energy, is dispersed over a range of angles. In the dispersion, from the foregoing equation and the known relationship that the energy of the incident x-ray radiation is proportional to its frequency and inversely proportional to its wavelength, the constituents of the x-ray radiation are dispersed through angles proportional to the inverse sine of the wavelength of the constituents.

In the apparatus shown in FIG. 1, it is convenient to use a monocrystalline silicon wafer as the single crystal 20, for example, with a (110) orientation, perpendicular to the axis of symmetry of portions 7 and 8. It may also be important to select a particular crystalline orientation of the single crystal material 20 transverse to, as well as parallel to, the x-ray radiation. Other single crystal materials besides silicon may be used as the dispersing means provided that the interatomic spacing d of the chosen crystalline orientation of the single crystal material is appropriate for dispersing the x-ray radiation.

Figure 2:
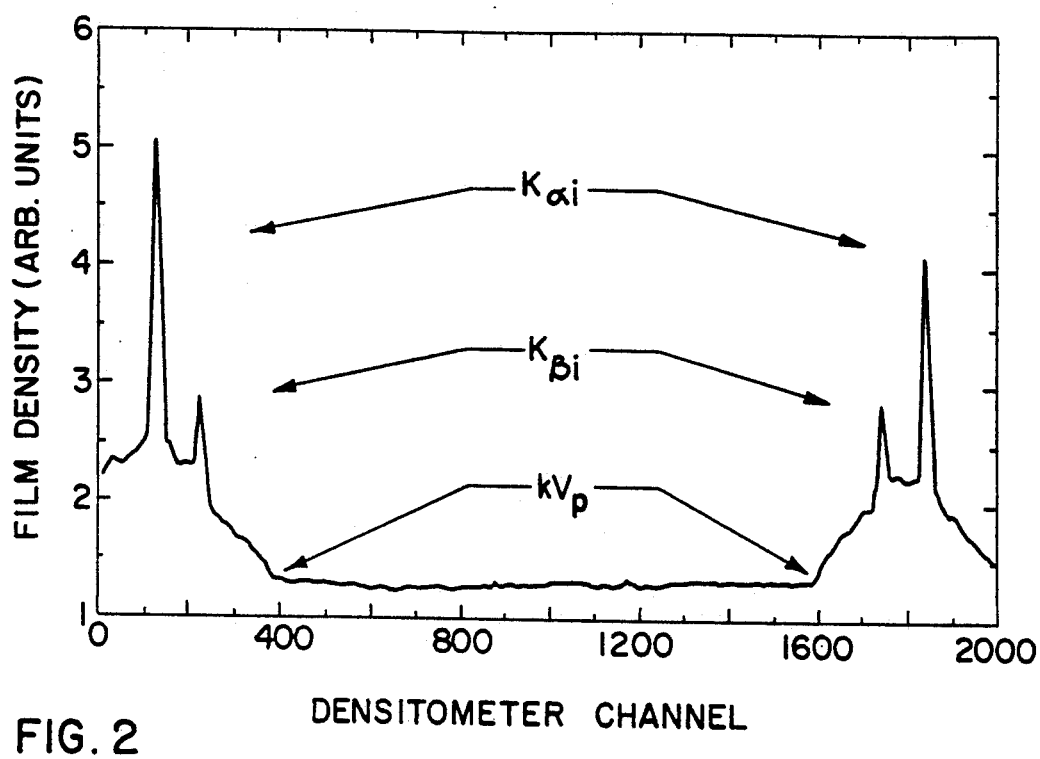
FIG. 2 is an image of x-ray spectra produced by the spectrograph of FIG. 1.

The dispersed x-rays, i.e., the x-ray spectrum or spectra, pass through a slit 21 and are incident on a film 22, such as a photographic film, that is sensitive to and forms an image of the incident x-ray radiation. The spacing between features of the x-ray spectrum or spectra in the image formed on the film 22 depends upon the distance, L, between the slit 21 and the film 22. In using the apparatus shown in FIG. 1, with the two portions 7 and 8, two x-ray spectra are produced in a symmetrical, mirror image form, as illustrated in FIG. 2. In this apparatus, the spacing between identical features in each of the spectra is equal to $$2L \tan [\text{arc } \sin(\lambda/2d)] \qquad (1).$$

Turning to FIG. 2, an example of mirror image spectra produced when the apparatus of FIG. 1 is used with a photographic film as the film 22 is illustrated. FIG. 2 itself is not the photographic image of the x-ray spectra but an analysis of such an image prepared using a conventional densitometer. In FIG. 2, two prominent x-ray radiation lines are apparent in each spectrum. In addition, the continuous radiation x-ray component is present between and on both sides of the x-ray lines. That continuous component is displayed in the spectra as a function of energy that increases from the outside edges of FIG. 2 toward the center of FIG. 2. In the central part of FIG. 2, the density of the image on the film is small and relatively constant. The constant value indicates the absence or near absence of incident radiation and is a background value. The points of transition from the varying amplitude continuous component of the x-ray spectra and the essentially constant background are the end point energies, one for each spectrum, referred to above. The relatively constant background is due, in part, to the shield 9 and the baffle 10 that prevent undiffracted x-ray radiation from reaching the film 22 and increasing the background value, i.e., "fogging" the film 22. The shield 9 and the baffle 10 may not be necessary in some situations.

In FIG. 2, the end point energies in each of the spectral halves can be readily located and the distance between the two end points can be easily measured. For a fixed spectrograph geometry, the separation between the end points can be measured and directly converted to an accelerating voltage. Alternatively, either or both of the end point energies can be converted to an accelerating voltage using the knowledge that end point energy equals the electronic charge multiplied by the accelerating voltage.

With regard to the mirror image spectra of FIG. 2, in Equation 1 every factor except $\lambda$, the wavelength, which can be easily converted to energy, is known for a fixed geometry spectrograph and a selected single crystal material. Thus, when the separation $\Delta$ between the end point energies of the two spectra is determined from the image shown in FIG. 2, the accelerating voltage can be directly calculated. In other words, through the following equations, the peak accelerating voltage, kVp, as a function of the separation, $\Delta$, of the end point energies on the symmetrical, mirror image spectra of FIG. 2 can be readily determined using fundamental physical relationships.

$$\Delta = 2L \tan[\arc \sin(\lambda/2d)]$$

$$\Delta = 2L \tan[\arc \sin(hc/2dE)]$$

$$\Delta = 2L \tan[\arc \sin(hc/2dekVp)]$$

$$\arc \tan(\Delta/2L) = \arc \sin(hc/2dekVp)$$

where h is Planck's constant, c is the speed of light, E is the end point energy, and the other terms have been previously identified. Solving for the accelerating voltage, $$kVp = \frac{hc}{2de \sin\left[\arc \tan\left(\frac{\Delta}{2L}\right)\right]}.$$

If only one-half of the mirror image shown in FIG. 2 is generated, i.e., only a single spectrum, then energy as a function of position in the spectrum can be determined using the known energies of the characteristic lines of the x-ray tube target and the dispersion relationship previously described. Because the characteristic line wavelengths and energies are well known, the energy of a spectral feature at a fixed location in the image, such as the end point energy, can be easily determined from these known energies. The end point energy so determined is readily converted to an accelerating voltage since the end point energy equals e(kVp).

Figure 3:
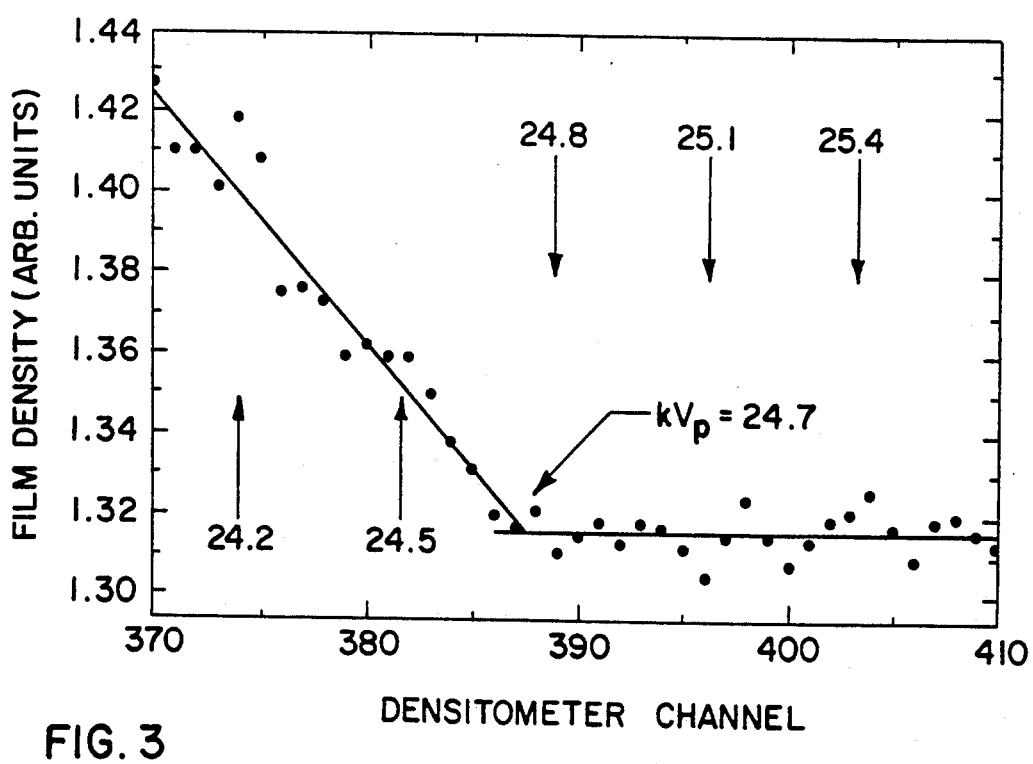
FIG. 3 is an enlarged view of a portion of one spectrum of FIG. 2.

FIG. 3 is an enlargement of one of the "corners" of FIG. 2, i.e., where the continuous spectrum ends at the end point energy and the background energy begins. It is apparent from FIG. 3 that the end point energy can be accurately determined based upon a linear fit of straight lines to the measured image density data. From that figure, it is apparent that the peak accelerating voltage kVp applied to the x-ray tube to produce the image can be determined, according to the invention, from the intersection of two straight lines to an accuracy within 0.1 kV, a significant improvement over the best techniques employed in the prior art.

The spectrograph and the images it produces can be calibrated, if desired, using the characteristic x-ray lines of known energy. The distances between those lines in the mirror image spectra can be similarly used to establish a direct calibration. Likewise, a single spectrum can be calibrated with the characteristic lines of known energy. A single calibration point is sufficient to define energies over the entire spectrum using the known dispersion relationship and is, therefore, sufficient to determine a wide variety of accelerating voltages. Alternatively, accelerating voltages can be invasively measured using a voltage divider and the traditional method of voltage calibration to calibrate spectrographic images.

Figure 4:
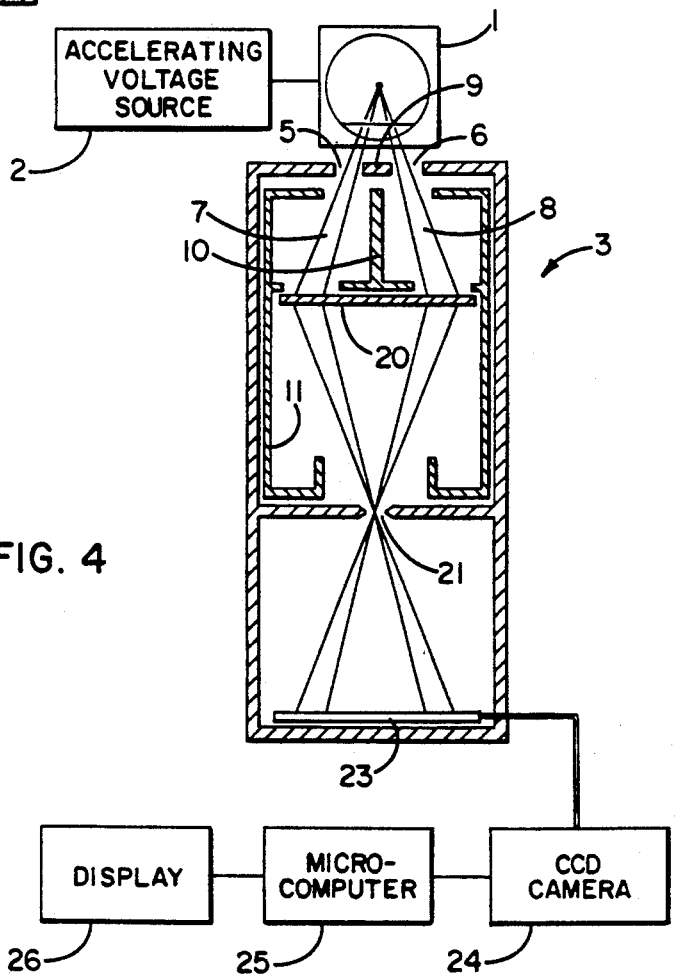
FIG. 4 is a block diagram of an embodiment of an apparatus according to the invention for automatically and accurately measuring accelerating voltage.

When the spectral image is formed on a photographic film, the film is analyzed with a densitometer to locate the end point energy or energies and to determine the accelerating voltage. Since the production of photographic images and their analysis requires considerable time, it is preferable to provide an apparatus for automatic determination of accelerating voltages as shown in the schematic block diagram of FIG. 4. In that apparatus, the photographic film 22 is replaced by a scintillation screen 23, for example, of gadolinium oxysulfide.

The scintillation screen 23 produces light in response to incident x-rays and the scintillations are detected by a CCD camera 24 disposed directly opposite the scintillation screen. In fact, it is preferred that the scintillation screen 23 be applied directly to the CCD camera 24. In this arrangement, the x-ray spectrum appears as a light image that is detected by the CCD camera 24. In response, an electrical signal is produced by the CCD camera. The electrical signal carries the image of the x-ray spectral distribution. The electrical signal is delivered to a microcomputer 25 that automatically analyzes the electrical signal. As in the densitometer measurement of a photographic film, the analysis seeks the end point energy or energies where the continuous component of the x-ray radiation spectrum stops changing with energy i.e., wavelength, and becomes constant, indicating a background energy level not related to x-ray emission from the source. That end point energy information is used in combination with previously supplied energy calibrations to determine the accelerating voltage applied to the x-ray tube. The analysis is driven and completed by software stored in and used by the microcomputer 25. The microcomputer 26 may employ presently available spectral analysis software, such as the IMAGE program developed by the National Institutes of Health. The results of that determination are provided on a display 26 for use by the technician calibrating an x-ray apparatus.

The procedure employed to calibrate an x-ray apparatus accelerating voltage indicator is straightforward. Spectra are generated at various voltage settings of the voltage indicator 1 of the apparatus and the end point energies, i.e., the actual peak accelerating voltages applied to the x-ray source, are determined from the spectra. The actual peak accelerating voltages are determined either from photographic images or from electrical images using the apparatus illustrated in FIGS. 1 or 4. The apparatus of FIG. 4 permits a real time, rapid calibration of the accelerating voltage indicator. A chart or graph of the actual peak accelerating voltages applied versus the peak accelerating voltages indicated by the apparatus is produced. The chart or graph is then consulted by a technician using the equipment for medical purposes to ensure that the appropriate peak accelerating voltage is applied to the x-ray source to obtain proper contrast in an x-ray image produced for a particular purpose.

The invention has been described with respect to certain preferred embodiments. Various additions and modifications within the spirit of the invention will occur to those of skill in the art. Accordingly, the scope of the invention is limited solely by the following claims.

I claim:

1. A method of measuring an accelerating voltage applied to an x-ray source to produce x-rays comprising:

applying an accelerating voltage to an x-ray source to produce x-ray radiation;

diffracting portions of the x-ray radiation that are symmetrically disposed relative to an axis with a single crystal material to produce two spectra of the x-ray radiation, each spectrum including continuous x-ray radiation having an end point energy at the maximum energy of the x-ray radiation;

forming an image of the spectra of the x-ray radiation including respective end point energies; and measuring the separation of the respective end point energies of the spectra of the image and, thereby, determining the accelerating voltage applied to the x-ray source.

2. The method of claim 1 including forming the image on a photographic film and locating the end point energies by measuring the density of the image on the film to locate the end point energies where the density of the image stops changing with position and remains relatively constant.

3. The method of claim 1 including forming the image on a scintillation film and sensing the image with a charge coupled device camera on which the scintillation film is disposed.

4. The method of claim 3 including analyzing the image formed on the charge coupled device camera and locating the end point energies where the intensity of the image stops changing with position and remains relatively constant.

5. A method of calibrating an accelerating voltage indicator of an x-ray apparatus comprising:
applying an accelerating voltage to an x-ray source to produce x-ray radiation and recording the accelerating voltage indicated by an indicator of the x-ray apparatus;
diffracting portions of the x-ray radiation that are symmetrically disposed relative to an axis with a single crystal material to produce two spectra of the x-ray radiation, each spectrum including continuous x-ray radiation having an end point energy at the maximum energy of the x-ray radiation;
forming an image of the spectra of the x-ray radiation including respective end point energies;
measuring the separation between the respective end point energies of the spectra and, thereby, determining the accelerating voltage applied to the x-ray source;
comparing the accelerating voltage actually applied to the x-ray source to the indicated accelerating voltage; and
repeating the foregoing steps for a plurality of different accelerating voltages to determine, for each applied accelerating voltage, the accelerating voltage actually applied and the indicated accelerating voltage, thereby calibrating the accelerating voltage indicator.

6. A method of measuring an accelerating voltage applied to an x-ray source to produce x-rays comprising:
applying an accelerating voltage to an x-ray source to produce x-ray radiation;
diffracting a portion of the x-ray radiation with a single crystal material to produce a spectrum of the x-ray radiation including continuous x-ray radiation having an end point energy at the maximum energy of the x-ray radiation;
forming an image of the spectrum of the x-rays including the end point energy; and
determining one of the wavelength and frequency of the end point energy and, thereby, the accelerating voltage applied to the x-ray source.

7. The method of claim 6 including forming the image on a photographic film and locating the end point energy by measuring the density of the image on the film to locate the end point energy where the density of the image stops changing with position and remains constant.

8. The method of claim 6 including forming the image on a scintillation screen and sensing the image with a charge coupled device camera on which the scintillation screen is disposed.

9. The method of claim 8 including analyzing the image formed on the charge coupled device camera and locating the end point energy where the intensity of the image stops changing with position and remains constant.

10. A method of calibrating an accelerating voltage indicator of an x-ray apparatus comprising:
applying an accelerating voltage to an x-ray source to produce x-ray radiation and recording the accelerating voltage indicated by an indicator of the x-ray apparatus;
diffracting a portion of the x-ray radiation with a single crystal material to produce a spectrum of the x-ray radiation including continuous x-ray radiation having an end point energy at the maximum energy of the x-ray radiation;
forming an image of the spectrum of the x-rays including the end point energy;
determining one of the wavelength and frequency of the end point energy and, thereby, the accelerating voltage actually applied to the x-ray source;
comparing the accelerating voltage actually applied to the x-ray source to the indicated accelerating voltage; and
repeating the foregoing steps for a plurality of different accelerating voltages to determine, for each applied accelerating voltage, the accelerating voltage actually applied and the indicated accelerating voltage, thereby calibrating the accelerating voltage indicator.

11. An apparatus for measuring an accelerating voltage applied to an x-ray source to produce x-rays comprising:
an x-ray spectrograph comprising an entrance for admitting two portions of x-ray radiation emitted by an x-ray source;
a single crystal material disposed to intersect and disperse the portions of the x-ray radiation to produce two x-ray spectra including continuous x-ray radiation having respective end point energies as the maximum energy of the x-ray radiation;
a scintillation screen emitting light in response to incident x-ray radiation for forming an image in light of the portions of the x-ray radiation dispersed by the single crystal material;
a charge coupled device camera disposed adjacent the scintillation screen for converting the image in light to electrical signals; and
a computer electrically connected to the charge coupled device camera for analyzing the electrical signals and finding the separation between the end point energies in the image where the intensity of the x-ray spectrum stops changing and remains constant, thereby determining the accelerating voltage applied to the x-ray source.

12. An apparatus for measuring an accelerating voltage applied to an x-ray source to produce x-rays comprising:
an x-ray spectrograph comprising an entrance for admitting a portion of x-ray radiation emitted by an x-ray source;
a single crystal material disposed to intersect and disperse the portion of the x-ray radiation to produce an x-ray spectrum including continuous x-ray radiation having an end point energy as the maximum energy of the x-ray radiation;

a scintillation screen emitting light in response to incident x-rays for forming an image in light of the portion of the x-ray radiation dispersed by the single crystal material;

a charge coupled device camera disposed adjacent the scintillation screen for converting the image in light to electrical signals; and a computer electrically connected to the charge coupled device camera for analyzing the electrical signals and finding the end point energy in the image where the intensity of the x-ray spectrum stops changing and remains constant, thereby determining the accelerating voltage applied to the x-ray source.

* * * * *